(12) United States Patent
Tosaya et al.

(10) Patent No.: US 8,008,133 B2
(45) Date of Patent: Aug. 30, 2011

(54) CHIP PACKAGE WITH CHANNEL STIFFENER FRAME

(75) Inventors: Eric Tosaya, Fremont, CA (US); Jun Zhai, San Jose, CA (US); Chia-Ken Leong, Santa Clara, CA (US); Tom Ley, Cupertino, CA (US)

(73) Assignee: Globalfoundries Inc., Grand Cayman (KY)

( * ) Notice: Subject to any disclaimer, the term of this patent is extended or adjusted under 35 U.S.C. 154(b) by 654 days.

(21) Appl. No.: 12/029,305

(22) Filed: Feb. 11, 2008

(65) Prior Publication Data

US 2009/0200659 A1 Aug. 13, 2009

(51) Int. Cl.
*H01L 21/00* (2006.01)

(52) U.S. Cl. .. 438/126; 438/121; 438/127; 257/E21.499

(58) Field of Classification Search ................... 438/121, 438/124, 125, 126, 127
See application file for complete search history.

(56) References Cited

U.S. PATENT DOCUMENTS

| | | | |
|---|---|---|---|
| 5,866,943 A | 2/1999 | Mertol | |
| 6,046,077 A | 4/2000 | Baba | |
| 6,114,763 A | 9/2000 | Smith | |
| 6,224,711 B1 | 5/2001 | Carden et al. | |
| 6,313,521 B1 | 11/2001 | Baba | |
| 6,410,981 B2 * | 6/2002 | Tao | 257/704 |
| 6,445,062 B1 | 9/2002 | Honda | |
| 6,509,630 B1 | 1/2003 | Yanagisawa | |
| 6,756,685 B2 | 6/2004 | Tao | |
| 6,936,499 B2 * | 8/2005 | Shibata et al. | 438/108 |
| 6,944,945 B1 | 9/2005 | Shipley et al. | |
| 6,951,773 B2 * | 10/2005 | Ho et al. | 438/106 |
| 6,979,636 B1 | 12/2005 | Lin et al. | |
| 2001/0017408 A1 | 8/2001 | Baba | |
| 2002/0114144 A1 | 8/2002 | Kumamoto et al. | |
| 2003/0025180 A1 | 2/2003 | Alcoe et al. | |
| 2003/0178722 A1 | 9/2003 | Xie et al. | |
| 2004/0099958 A1 | 5/2004 | Schildgen et al. | |
| 2004/0150118 A1 | 8/2004 | Honda | |
| 2005/0028360 A1 * | 2/2005 | Ireland | 29/840 |
| 2005/0230797 A1 | 10/2005 | Ho et al. | |
| 2005/0282310 A1 | 12/2005 | Zhou | |

(Continued)

FOREIGN PATENT DOCUMENTS

JP 9283889 10/1997

(Continued)

OTHER PUBLICATIONS

USPTO Office Action mailed Mar. 27, 2009; U.S. Appl. No. 11/748,618.

(Continued)

*Primary Examiner* — Charles D Garber
*Assistant Examiner* — Reema Patel
(74) *Attorney, Agent, or Firm* — Ditthavong Mori & Steiner, P.C.

(57) ABSTRACT

Various semiconductor chip packages and methods of making the same are provided. In one aspect, a method of manufacturing is provided that includes providing a substrate that has a first side and a first plurality of passive devices on the first side. A stiffener frame is coupled on the first side. The stiffener frame has first and second spaced apart opposing walls that define a channel in which the first plurality of passive devices is positioned, and a central opening that does not cover a central portion of the first side of the substrate.

21 Claims, 6 Drawing Sheets

U.S. PATENT DOCUMENTS

| | | | |
|---|---|---|---|
| 2006/0208356 A1 | 9/2006 | Yamano et al. | |
| 2006/0249852 A1 | 11/2006 | Chiu et al. | |
| 2007/0132072 A1* | 6/2007 | Chang | 257/666 |
| 2008/0001308 A1 | 1/2008 | Chen | |
| 2008/0054490 A1* | 3/2008 | McLellan et al. | 257/778 |
| 2008/0142996 A1 | 6/2008 | Subramanian et al. | |

FOREIGN PATENT DOCUMENTS

| | | |
|---|---|---|
| JP | 3161706 | 8/2000 |
| JP | 3180794 | 4/2001 |
| JP | 3189270 | 5/2001 |
| JP | 3219043 | 8/2001 |
| JP | 3228339 | 9/2001 |
| JP | 2002190560 | 7/2002 |
| JP | 3367554 | 11/2002 |
| JP | 3384359 | 12/2002 |
| JP | 3385533 | 1/2003 |
| JP | 2003051568 | 2/2003 |
| JP | 3459804 | 8/2003 |
| JP | 2004260138 | 9/2004 |
| JP | 200767010 | 3/2007 |

OTHER PUBLICATIONS

U.S. Appl. No. 12/435,147, filed May 4, 2009, Stephen Heng et al.

U.S. Appl. No. 11/748,618, filed May 15, 2007, Eric Tosaya.

U.S. Appl. No. 12/051,330, filed Mar. 19, 2008, Roden Topacio.

Horatio Quinones et al.; *Flip Chip Encapsulation Reliability*; ASYMTEK; Aug. 1998; pp. 1-13.

Richard Blish, Ph.D.; *Use Condition Based Reliability Evaluation of New Semiconductor Technologies*; SEMATECH; Aug. 31, 1999; pp. 1-24.

National Electronics Center of Excellence; *Empfasis-Lead Free Soldering for Sustainment*; A publication of the National Electronics Manufacturing Center for Excellence; http://www.empf.org/empfasis/oct03/3403pbsustain.htm; Mar./Apr. 2003; pp. 1-3.

K.C. Norris et al.; *Reliability of Controlled Collapse Interconnections*; IBM J. Res. Development; May 1969; pp. 1-6.

Werner Engelmaier; *Solder Joints in Electronics: Design for Reliability*; 1999; pp. 1-13.

PCT/IB2009/000561 International Search Report.

USPTO Office Action notification date Aug. 17, 2009; U.S. Appl. No. 11/748,618.

U.S. Appl. No. 12/198,227, filed Aug. 26, 2008, Mohammad Khan et al.

* cited by examiner

CHIP PACKAGE WITH CHANNEL STIFFENER FRAME

BACKGROUND OF THE INVENTION

1. Field of the Invention

This invention relates generally to semiconductor processing, and more particularly to semiconductor chip packaging and to methods of making the same.

2. Description of the Related Art

Many current integrated circuits are formed as multiple die on a common silicon wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a material that prevents damage to the solder bumps due to mismatches in the coefficients of thermal expansion between the die and the substrate, and an adhesive to hold the die. The substrate interconnects include an array of solder pads that are arranged to line up with the die solder bumps. After the die is seated on the substrate, a reflow process is performed to enable the solder bumps of the die to metallurgically link to the solder pads of the substrate. After the die is mounted to the substrate, a lid is attached to the substrate to cover the die. Some conventional integrated circuits, such as microprocessors, generate sizeable quantities of heat that must be ferried away to avoid device shutdown or damage. For these devices, the lid serves as both a protective cover and a heat transfer pathway.

One conventional type of substrate consists of a core laminated between upper and lower build-up layers. The core itself usually consists of four layers of glass filled epoxy. The build-up layers, which may number four or more on opposite sides of the core, are formed from some type of resin. Various metallization structures are interspersed in the core and build-up layers in order to provide electrical pathways between pins or pads on the lowermost layer of the substrate and pads the solder pits that bond with the chip solder bumps.

The core provides a certain stiffness to the substrate. Even with that provided stiffness, conventional substrates still tend to warp due to mismatches in coefficients of thermal expansion for the chip, underfill and substrate. However, there is a need to provide shorter electrical pathways in package substrates in order to lower power supply inductance and improve power fidelity for power transferred through the substrate. The difficult problem is how to reduce the electrical pathways without inducing potentially damaging substrate warping.

The present invention is directed to overcoming or reducing the effects of one or more of the foregoing disadvantages.

SUMMARY OF THE INVENTION

In accordance with one aspect of the present invention, a method of manufacturing is provided that includes providing a substrate that has a first side and a first plurality of passive devices on the first side. A stiffener frame is coupled on the first side. The stiffener frame has first and second spaced apart opposing walls that define a channel in which the first plurality of passive devices is positioned, and a central opening that does not cover a central portion of the first side of the substrate.

In accordance with another aspect of the present invention, a method of manufacturing is provided that includes forming a stiffener frame that has first and second spaced apart opposing walls coupled to a top portion that define an open channel, and a central opening. The stiffener frame is coupled to a substrate that has a first side and a first plurality of passive devices on the first side. The open channel is positioned over the first plurality of passive devices with the central opening not covering a central portion of the first side of the substrate.

In accordance with another aspect of the present invention, a method of manufacturing is provided that includes providing a substrate that has a first side and a first plurality of passive devices on the first side. A stiffener frame is coupled on the first side. The stiffener frame has first and second spaced apart opposing walls that define a channel in which the first plurality of passive devices is positioned, and a central opening not covering a central portion of the first side of the substrate. A semiconductor chip is mounted on the central portion of the first side of the substrate, and a lid is coupled to the stiffener frame to cover the semiconductor chip.

In accordance with another aspect of the present invention, an apparatus is provided that includes a substrate that has a first side and a first plurality of passive devices on the first side. A stiffener frame is on the first side. The stiffener frame has first and second spaced apart opposing walls that define a channel in which the first plurality of passive devices is positioned, and a central opening that does cover a central portion of the first side of the substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
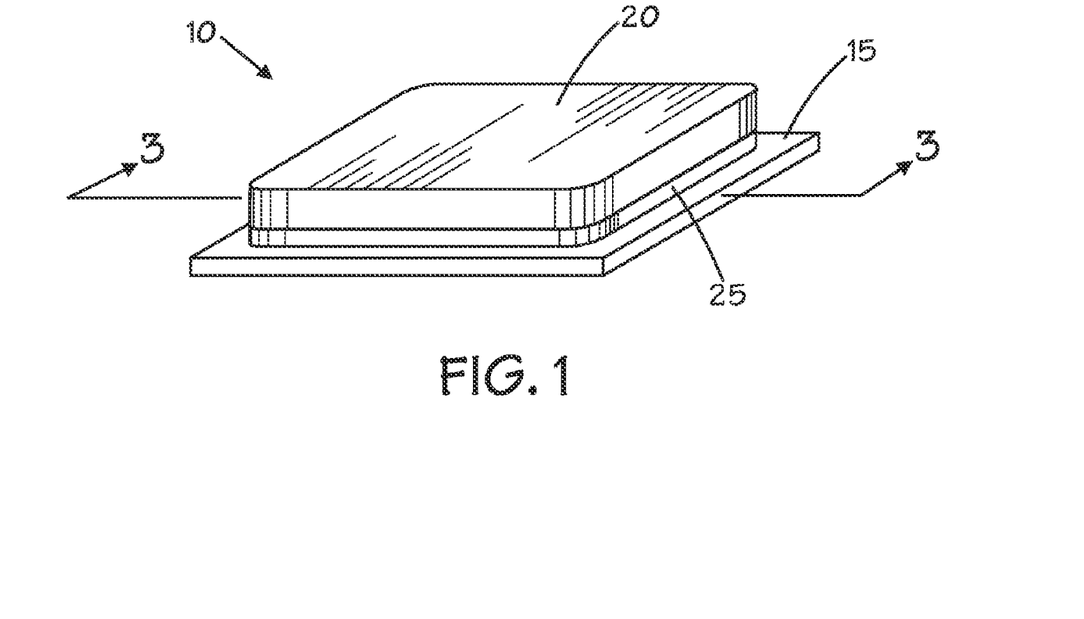
FIG. 1 is a pictorial view of an exemplary embodiment of an integrated circuit package.

In the drawings described below, reference numerals are generally repeated where identical elements appear in more than one figure. Turning now to the drawings, and in particular to FIG. 1, therein is shown a pictorial view of an exemplary embodiment of an integrated circuit package 10 that includes a substrate 15, an overlying lid 20 and a channel stiffener frame 25. The channel stiffener frame 25 is sandwiched between the substrate 15 and the lid 20. The substrate 15 is configured as a land grid array ("LGA") but may optionally be a pin grid array, a ball grid array or other type of mountable substrate as desired. The lid 20 covers an integrated circuit (not visible) that is mounted on the substrate 15. Optionally, the package 10 may be lidless, partially or completely overmolded, or glob topped.

Figure 2:
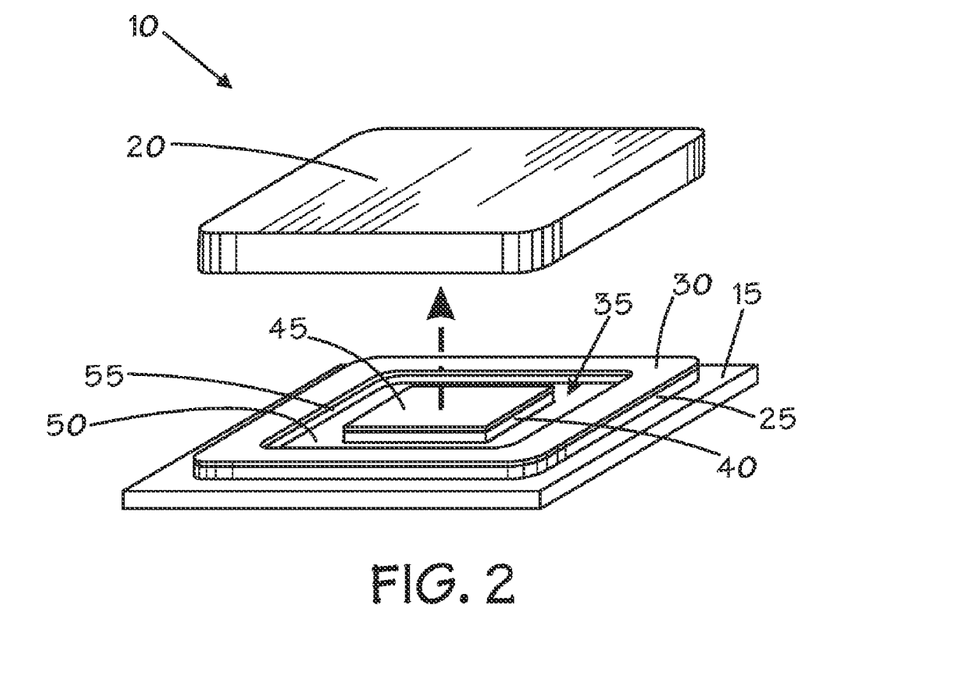
FIG. 2 is a pictorial view like FIG. 1, but with an exemplary lid exploded from the package substrate.

Additional detail regarding the structure of the package 10 may be understood by referring now also to FIG. 2, which is a pictorial view like FIG. 1 but with the lid 20 exploded from the substrate 15. An upper surface of the channel stiffener frame 25 is provided with an adhesive film 30 that holds the lid 20 in place. The channel stiffener frame 25 has a footprint that generally tracts the outline of the overlying lid 20. The channel stiffener frame 25 is a frame-like structure that does not cover a central portion 35 of the substrate 15. It should be understood that the channel stiffener frame 25 may extend laterally to the edges of the substrate 15 if desired.

An integrated circuit 40, which may be a semiconductor chip or other type of device as desired, is mounted on the central portion of the substrate 15. The integrated circuit 40 may be any of a myriad of different types of circuit devices used in electronics, such as, for example, microprocessors, graphics processors, combined microprocessor/graphics processors, application specific integrated circuits, memory devices or the like, and may be single or multi-core. Optionally, multiple chips may be used. The integrated circuit 40 includes a thermal interface material 45 that is designed to provide an advantageous conductive heat transfer pathway between the integrated circuit 40 and the overlying lid 20. An underfill material 50 may be provided beneath and lateral to the semiconductor chip 40. The underfill material 50 may extend away from the semiconductor chip 40 to the inner wall 55 of the channel stiffener frame 25.

Figure 3:
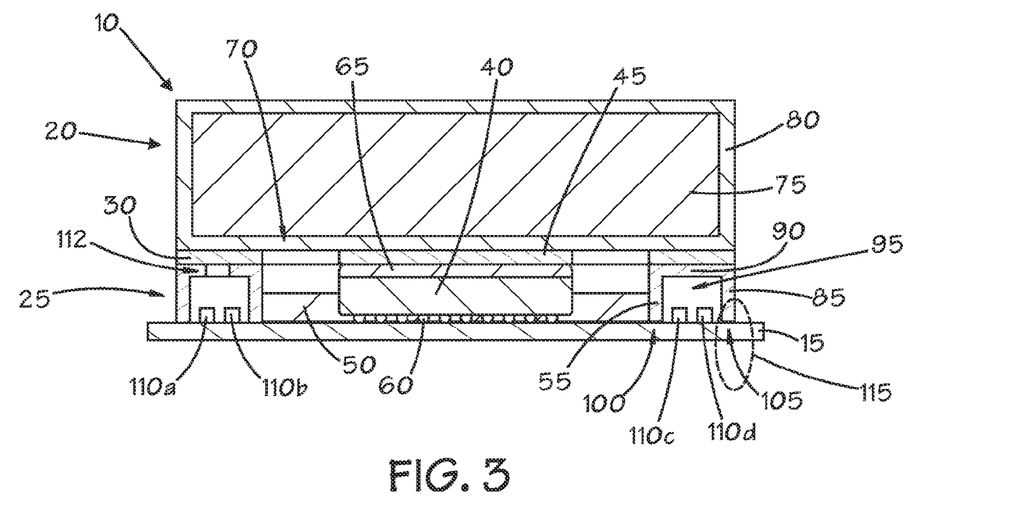
FIG. 3 is a sectional view of FIG. 1 taken at section 3-3.

Still further details of the package 100 may be understood by referring now to FIG. 3, which is a sectional view of FIG. 1 taken at section 3-3. The integrated circuit 40 is mounted in flip-chip fashion and connected electrically to the substrate 15 by plurality of solder bumps 60. The aforementioned underfill material 50 is positioned between the integrated circuit 40 and the substrate 15 to address issues of differing coefficients of thermal expansion for the substrate 15 and the integrated circuit 40. A backside metallization layer or stack 65 may be provided on the upper surface of the integrated circuit 40 to provide one or more layers that facilitate metallurgical bonding with the thermal interface material 45. The materials suitable for the stack 65 will depend on the type of thermal interface material 45. The thermal interface material 45 is designed to bond with a lower surface 70 of the lid 20 and provide an effective conductive heat transfer pathway between the integrated circuit 40 and the lid 20. The thermal interface material 45 is advantageously composed of metallic materials, such as indium, but may also be composed of polymeric materials such as, for example, silicone rubber mixed with aluminum particles and zinc oxide. Optionally, compliant base materials other than silicone rubber and thermally conductive particles other than aluminum may be used.

The skilled artisan will appreciate that a bumpless interconnect may be used to coupled the integrated circuit 40 to the substrate 15. In another variant, other than flip-chip mounting may be used, such as wire bonding or some other interface. Finally, the integrated circuit 40 may be stacked with other chips (not shown).

The lid 20 may be composed of well-known plastics, ceramics or metallic materials as desired. Some exemplary materials include nickel plated copper, anodized aluminum, aluminum-silicon-carbide, aluminum nitride, boron nitride or the like. In an exemplary embodiment, the lid 20 may consist of a copper core 75 surrounded by a nickel jacket 80. As noted above in conjunction with FIG. 2, the lid 20 is secured to the channel stiffener frame 25 by way of an adhesive bead 30. A variety of lid geometries may be used, such as block, bathtub, top hat or other configurations.

The channel stiffener frame 25 has a generally U-shaped cross-section defined by the inner wall 55, an outer wall 85 spaced apart from and opposing the inner wall 55, and a top portion 90 connected to both. The inner wall 55, the outer wall 85 and the top portion 90 collectively define an interior open channel 95. The inner and outer walls 55 and 85 have respective lower surfaces 100 and 105 that are secured to the substrate 15 by way of an adhesive that is not visible in FIG. 3. The channel 95 is designed to accommodate to a plurality of passive devices, four of which are visible and labeled 110a, 110b, 110c and 110d. The passive elements 110a, 110b, 110c and 110d are of such small size in FIG. 3 that they are not depicted with cross-hatching. The passive devices 110a, 110b, 110c and 110d may be capacitors, inductors, resistors or the like, or other types of circuit elements may be provided for the integrated circuit 40. Electrical interconnects between the passive devices 110a, 110b, 110c and 110d and the integrated circuit 40 are not visible. An optional opening 122 (or multiples of such) may be provided in the top portion 90 of the frame 25 to allow for outgassing. The opening 112 may extend around the entire perimeter of the frame 25 if desired.

The channel stiffener frame 25 provides a desirable amount of stiffening to the substrate 15 while still accommodating the passive elements 110a, 110b, 110c and 110d via the channel 95. In this way, the locations of the passive elements 110a, 110b, 110c and 110d on the substrate 15 need not be changed to accommodate a stiffening structure, and the passive elements 110a, 110b, 110c and 110d need not be encumbered by a solid material layer.

Figure 4:
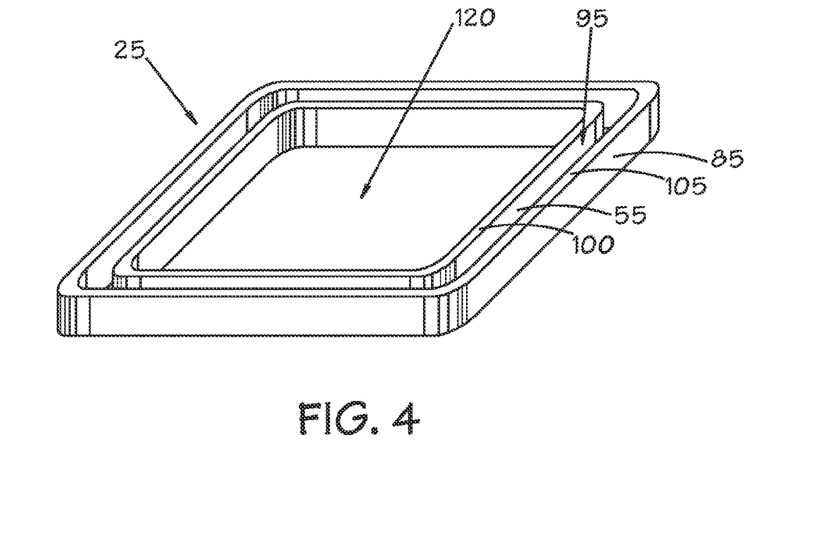
FIG. 4 is a pictorial view of an exemplary embodiment of a channel stiffener frame flipped over.
Figure 5:
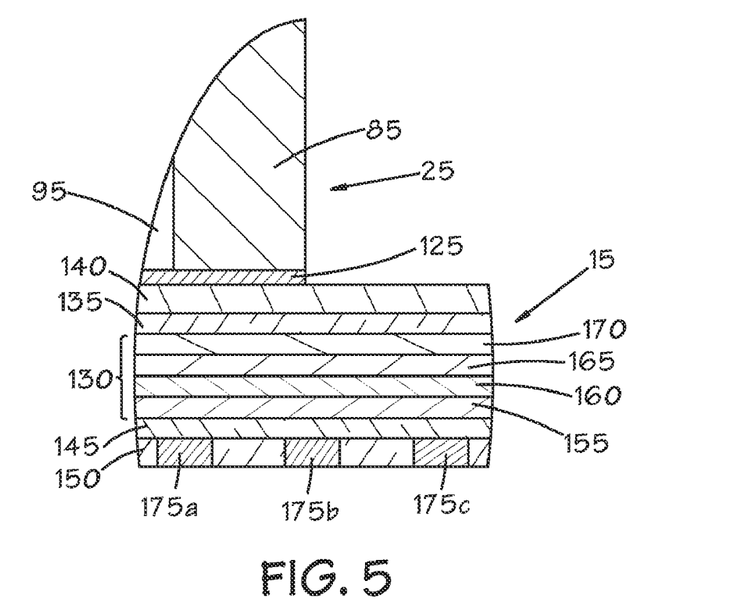
FIG. 5 is a magnified view of a small portion of FIG. 3.

The portion of FIG. 3 circumscribed by the dashed oval 115 will be used to describe additional details of the package 100 in conjunction with FIG. 5. For now though, attention is turned to FIG. 4, which is a pictorial view of the channel stiffener frame 25 flipped upside down to reveal the lower surfaces 100 and 105 of the inner wall 55 and the outer wall 85 and the interior channel 95 between the inner wall 55 and the outer wall 85. The inner wall 55 circumscribes a central opening 120 through which the semiconductor chip 40 shown in FIG. 3 may be inserted and mounted to the substrate 15.

As noted above, a small portion of FIG. 3 is circumscribed by the dashed oval 115. That small portion circumscribed by the dashed oval 115 is shown at greater magnification in FIG. 5. Attention is now turned to FIG. 5. Again it should be remembered that only a small portion of the outer wall 85 of the channel stiffener frame 25, the internal channel 95 of the channel stiffener frame 25, and the substrate 15 are visible in FIG. 5. In this view, an adhesive 125 that was previously not visible in FIG. 3 is now visible. As mentioned above, the adhesive 125 secures the lower surface 105 of the outer wall 85 to the substrate 15. A variety of adhesives may be used. In an exemplary embodiment, a silicone-based thixotropic adhesive may be used to provide a compliant bond. Optionally, a metallic bond using lead-free or lead-based solder may be used if the frame 25 can withstand the melting temperature of the solder. The substrate 15 may consist of a core/build-up configuration. In this regard, the substrate 15 may consist of a central core 130 upon which two build-up layers 135 and 140 are formed and below which two additional build-up layers 145 and 150 are formed. The core 130 itself may consist of a stack of four layers 155, 160, 165 and 170. This arrangement may be termed a so called "2-4-2" arrangement that refers to a four-layer core laminated between two sets of two build-up layers. The number of layers in the substrate 15 can vary from four to sixteen or more, although less than four may be used. Since the substrate 15 is depicted as a LGA configuration, the lowermost build-up layer 190 may be provided with a plurality of bond pads 175a, 175b and 175c that are designed to make ohmic contact with some form of conductor on a printed circuit board or other type of device. Of course, if the substrate 15 were configured as a pin grid array then downwardly projecting conductor pins would be depicted. The various layers of the core 130 and the build-up layers 135, 140, 145 and 150 will typically include metallization layers, vias, interconnects, etc. to establish conducting pathways between the bond pads 175a, 175b and 175c and the corresponding bond pads (not shown) that are electrically connected to the solder bumps 60 depicted in FIG. 3. The channel stiffener frame 25 is designed to provide, as its name implies, a stiffening for the substrate 15. This provision for an enhanced stiffening of the substrate 15 may be particularly advantageous in situations where a substrate is configured as a so-called thin core or coreless.

Figure 6:
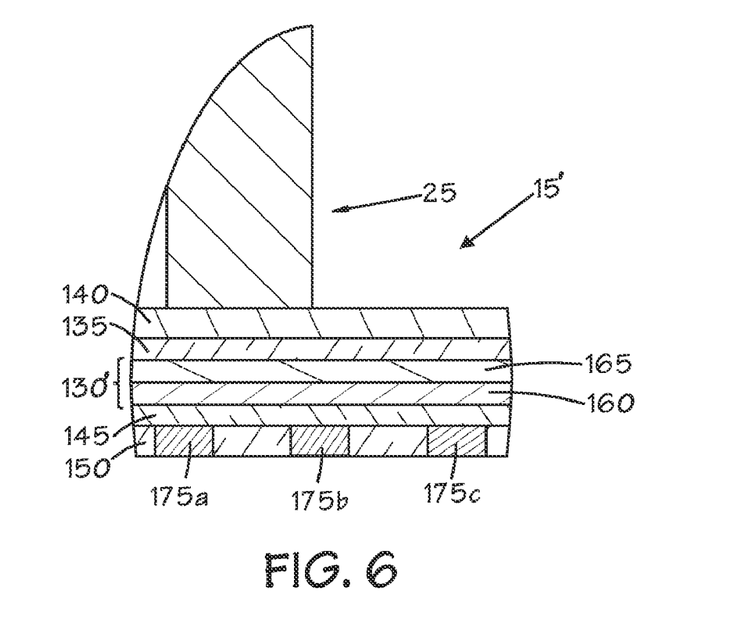
FIG. 6 is a view like FIG. 5, but of another alternate exemplary package.

An exemplary embodiment of a thin core substrate 15' is depicted in FIG. 6, which is a view like FIG. 5, but of the thin core substrate 15'. Here, the substrate 15' consists of a core 130' and two overlying build-up layers 135 and 140 and two underlying build-up layers 145 and 150. However, the core 130' consists of just two layers 160 and 165. In this circumstance, the core 130' and the overall substrate 15' will generally have a lower native stiffness than a substrate with a larger core. In this circumstance, the provision of the channel stiffener frame 25 will greatly enhance the overall stiffness of the substrate and thus the planarity and resistance to warpage thereof. Like the other embodiment depicted in FIG. 5, the lowermost build-up layer 150 may be provided with a plurality of bond pads 175a, 175b and 175c, and the channel stiffener frame 25 may be secured to the substrate 15' by an adhesive 125.

Figure 7:
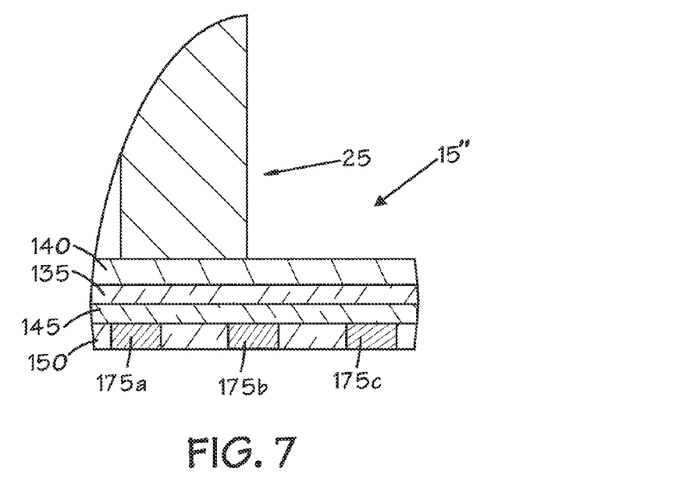
FIG. 7 is a view like FIG. 6, but of another alternate exemplary package.

As noted briefly above, the channel stiffener frame 25 may be employed on a substrate that is coreless. Such an alternate embodiment is depicted in FIG. 7, which is a sectional view like FIG. 6, but of a substrate 15" that is coreless. The substrate 15" is coreless in the sense that a core is not laminated between build-up layers. In this embodiment, the substrate 15" may consist of two build-up layers 135 and 140 stacked on two other build-up layers 145 and 150. Again the lowermost build-up layer 150 may include a plurality of bond pads 175a, 175b and 175c, and the channel stiffener frame 25 may be secured to the substrate 15" by an adhesive 125.

Figure 8:
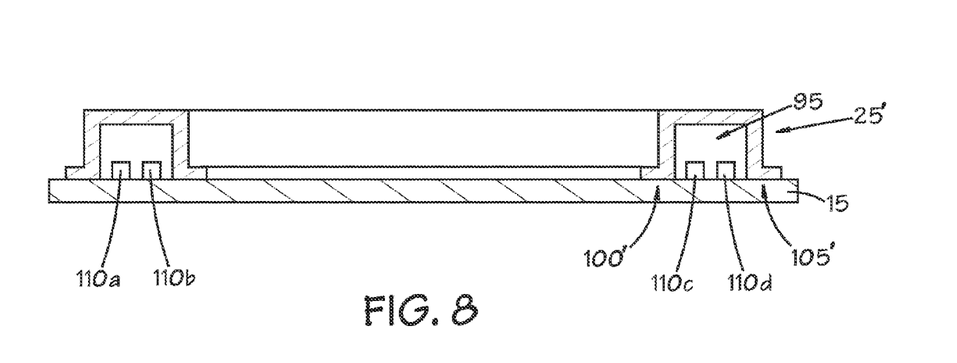
FIG. 8 is a sectional view of another exemplary channel stiffener frame and substrate.

An alternate exemplary embodiment of a channel stiffener frame 25' may be understood by referring now to FIG. 8, which is a sectional view of the channel stiffener frame 25' seated on the substrate 15 such that the passive devices 110a, 110b, 110c, and 110d are enclosed within an internal channel 95. In this illustrative embodiment, lower surfaces 100' and 105' of the channel stiffener frame 25' are expanded to form a flange that has a greater surface area then the embodiment depicted in FIG. 3. This increased surface area may be desirable in circumstances where a greater bonding area for an adhesive to secure the channel stiffener frame 25' to the substrate 15 is deemed necessary.

Figure 9:
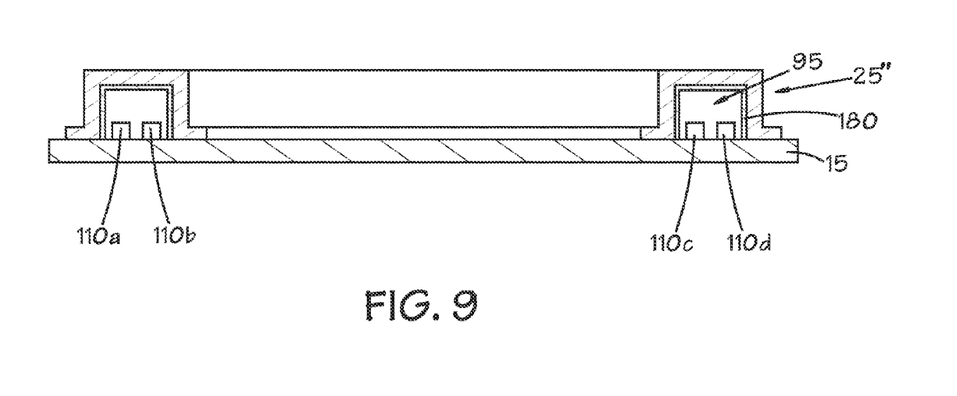
FIG. 9 is a sectional view of another exemplary channel stiffener frame and substrate.

Another alternate exemplary embodiment of a channel stiffener frame 25" may be understood by referring now to FIG. 9, which is a sectional view of the channel stiffener frame 25" seated on the substrate 15 such that the passive devices 110a, 110b, 110c, and 110d are enclosed within an internal channel 95. In this illustrative embodiment, the internal channel 95 may be lined with an insulating material layer 180. The insulating material layer 180 may be added where the channel stiffener frame 25" is fabricated from a conducting material or materials and it is deemed prudent to reduce the risk of short circuits between the channel stiffener frame 25" and the passive devices 110a, 110b, 110c, and 110d. The insulating material layer 180 may be formed from a variety of insulating materials, such as epoxy, acrylics, silicone-based coatings, other plastics, polyimide, other well-known polymeric materials or the like. It should be understood that any of the embodiments disclosed herein may use an insulating material layer of the type depicted in FIG. 9.

Figure 10:
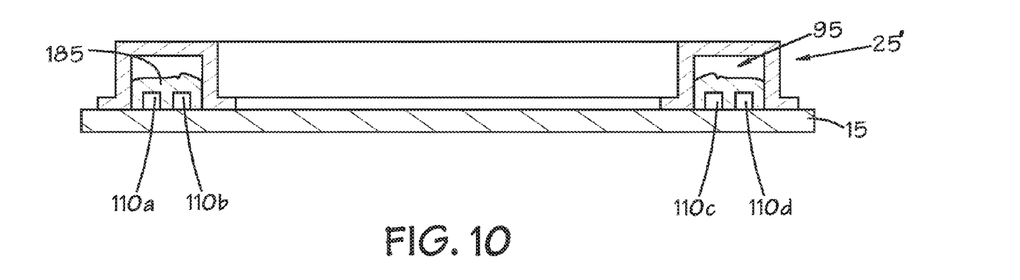
FIG. 10 is a sectional view of another exemplary channel stiffener frame and substrate.

Any of the embodiments of the channel stiffener frame disclosed herein may be used in conjunction with an insulating coating that may be placed over the passive devices. An example of this configuration is depicted in FIG. 10, which is a sectional view of the channel stiffener frame 25' seated on the substrate 15. Again, the internal channel 95 houses the passive devices 110a, 110b, 110c, and 110d. However, in this illustrative embodiment, an insulating material coating 185 is formed over the passive devices 110a, 110b, 110c, and 110d. The coating 185 may be applied over the passive devices 110a, 110b, 110c, and 110d prior to the seating of the channel stiffener frame 25' or after in the event the channel stiffener frame 25' is provided with a port (not shown) that would enable the material 185 to be injected into the internal channel 95. The insulating material layer 185 may be added where the channel stiffener frame 25' is fabricated from a conducting material or materials and it is deemed prudent to reduce the risk of short circuits between the channel stiffener frame 25" and the passive devices 110a, 110b, 110c and 110d. The insulating material 185 may be formed from a variety of insulating materials, such as, such as epoxy, acrylics, silicone-based coatings, other plastics, polyimide, other well-known polymeric materials or the like. If an adhesive type material is chosen, then the insulating material 185 may also serve as an adhesive to secure the frame 25' to the substrate 15.

Figure 11:
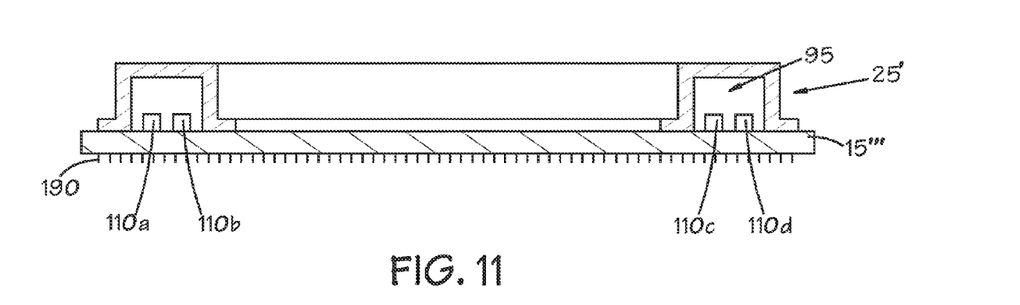
FIG. 11 is a sectional view of another exemplary channel stiffener frame and a pin grid array substrate.

As noted above, something other than a LGA design may be used. FIG. 11 is a sectional view of an alternate embodiment of a substrate 15'" that is configured as a pin grid array. A plurality of conductor pins 190 are coupled to the substrate 15'". Metallization layers (not visible) in the substrate 15'" provide electrical pathways between the pins 190 and a chip that may be mounted to the substrate 15'", such as the chip 40 shown in FIGS. 2 and 3. The substrate 15'" may be conventional core, thin core or coreless. The passive devices 110a, 110b, 110c, and 110d may be housed in the internal channel 95 of the channel stiffener frame 25'.

Figure 12:
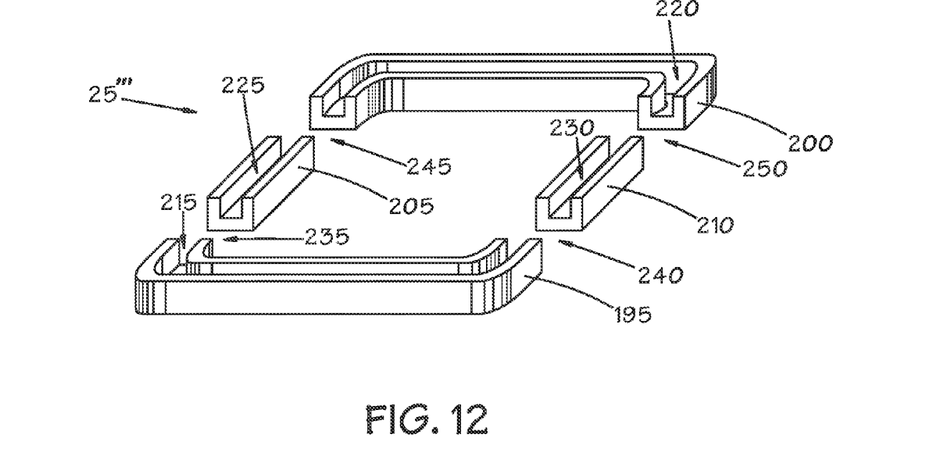
FIG. 12 is a pictorial view of another alternate exemplary channel stiffener frame incorporating a segmented configuration.

In the other embodiments disclosed herein, the channel stiffener frame is a unitary structure. However, the channel stiffener frame may be fabricated as a segmented structure. Such an exemplary embodiment is depicted in FIG. 12, which is a pictorial view of an exemplary channel stiffener frame 25'" that includes two end segments 195 and 200 and two middle segments 205 and 210. The end segments 195 and 200 may have respective internal channels 215 and 220 and the middle segments 205 and 210 may have respective internal channels 225 and 230. All of the segments 195, 200, 205 and 210 may be flipped over and placed on a given substrate (not shown) with the various channels 215, 220, 225 and 230 positioned over various passive devices of the substrate. The gaps 235 and 240 between the end segments 195 and the middle segments 205 and 210 and the gaps 245 and 250 between the middle segments 205 and 210 and the end segment 200 may be suitable in situations where it is desirable to provide pathways for outgassing. It should be understood that the number and geometry of the segments 195, 200, 205 and 210 may be varied. Indeed, a single C-shaped or horseshoe-shaped segment may be implemented.

Figure 13:
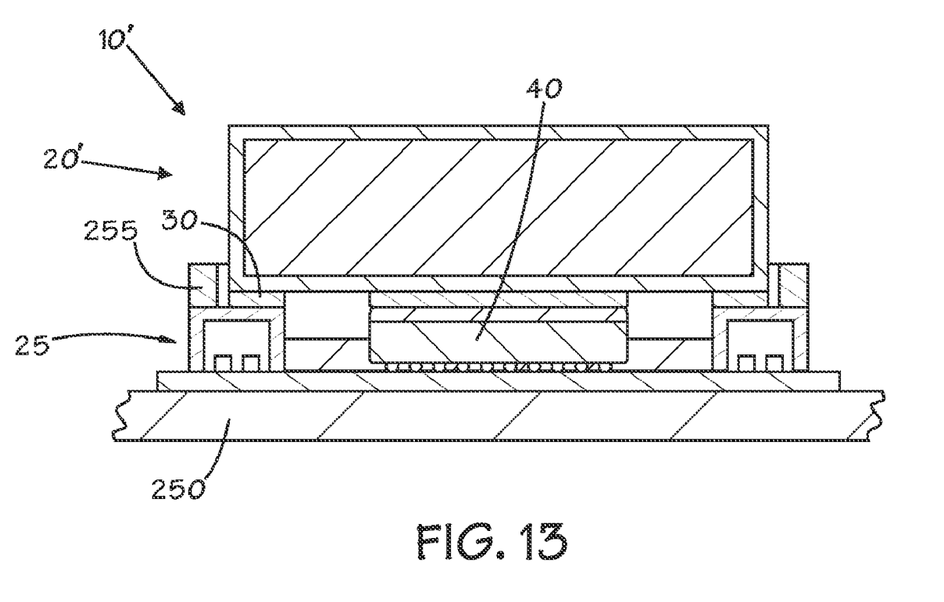
FIG. 13 is a sectional view of another exemplary embodiment.

In another exemplary embodiment depicted in section in FIG. 13, a channel stiffener frame 25 may serve as a clamping surface for securing a package 10' containing the integrated circuit 40 to a socket 250. The socket 250 may be part of another electronic device. A lid 20' is fashioned with a footprint that is smaller than the footprint of the stiffener frame 25 so that a socket clamp 255 may be seated on the frame 25 external to the lid 20'. An adhesive bead 30 will be correspondingly less extensive.

Any of the embodiments of a channel stiffener frame disclosed herein may be fabricated from a variety of materials. Corrosion resistance and favorable coefficients of thermal expansion are desirable characteristics. Examples include nickel plated copper, anodized aluminum, stainless steel, or the like. Metallic channel stiffener frames may be fabricated using forging, casting, or machining. A punching operation may be quite efficient.

Moldable polymeric materials, such as Teflon or epoxies, could also be used. Suitable candidates for a moldable polymeric material include materials that may be molded, directly to the substrate without an adhesive if desired, and that exhibit desired coefficients of thermal expansion and bulk modulus. The ability of the channel stiffener frame 25 to resist substrate warping will be greater where the moldable material hardens into a channel stiffener frame that has a coefficient of thermal expansion and a bulk modulus that approach or even equal that of the substrate 15. Various epoxy resins represent suitable materials. In one example, a 2-4-2 substrate with a coefficient of thermal expansion of about $22 \times 10^{-6}\, C^{\circ -1}$ and a bulk modulus of about 25 to 30 GPa may be matched with an epoxy resin available from Matsushita that has a coefficient of thermal expansion of about $14 \times 10^{-6}\, C^{\circ -1}$ and a bulk modulus of about 20 to 25 GPa. Thin core or coreless substrates may have coefficients of thermal expansion of between about $15 \times 10^{-6}\, C^{\circ -1}$ to $19 \times 10^{-6}\, C^{\circ -1}$. Accordingly, resins with coefficients of thermal expansion in that range may be suitable for thin or coreless substrates. Regardless of composition, any of the embodiments of a channel stiffener frame disclosed herein may be secured to a substrate before or after chip mounting.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   providing a substrate having a first side and a first plurality of passive devices on the first side; and
   coupling a stiffener frame on the first side, the stiffener frame having first and second spaced apart opposing walls defining a channel in which the first plurality of passive devices is positioned, and a central opening not covering a central portion of the first side of the substrate; wherein the channel surrounds the central opening.

2. The method of claim 1, comprising mounting a semiconductor chip on the central portion of the first side of the substrate.

3. The method of claim 1, comprising forming an insulating layer over the first plurality of passive devices.

4. The method of claim 1, wherein the coupling a stiffener frame comprises coupling an insulating layer on the first and second spaced apart walls in the channel.

5. The method of claim 1, wherein the coupling a stiffener frame comprises providing the stiffener frame with a flanged lower surface and securing the flanged lower surface to the first side of the substrate with an adhesive.

6. The method of claim 1, comprising coupling a plurality of bond pads to a second side of the substrate.

7. The method of claim 1, comprising coupling a plurality of conductor pins to the second side of the substrate.

8. The method of claim 1, wherein the providing of the substrate comprises providing a coreless substrate.

9. A method of manufacturing, comprising:
   forming a stiffener frame having first and second spaced apart opposing walls coupled to a top portion and defining an open channel, and a central opening;
   coupling the stiffener frame to a substrate having a first side and a first plurality of passive devices on the first side, the open channel being positioned over the first plurality of passive devices with the central opening not covering a central portion of the first side of the substrate; wherein the channel surrounds the central opening.

10. The method of claim 9, wherein the forming a stiffener frame comprises forming the first and second spaced apart walls and the top portion with a U-shaped cross-section.

11. The method of claim 10, wherein the forming a stiffener frame comprises forming a metal stiffener frame.

12. The method of claim 9, wherein the forming a stiffener frame comprises forming a first flange at a lower end of the first wall and a second flange at a lower end of the second wall.

13. The method of claim 9, comprising forming an insulating layer on the first and second spaced apart opposing walls in the open channel.

14. The method of claim 9, wherein the forming a stiffener frame comprises forming the stiffener as a series of segments each having an open channel.

15. A method of manufacturing, comprising:
   providing a substrate having a first side and a first plurality of passive devices on the first side;
   coupling a stiffener frame on the first side, the stiffener frame having first and second spaced apart opposing walls defining a channel in which the first plurality of passive devices is positioned, and a central opening not covering a central portion of the first side of the substrate; wherein the channel surrounds the central opening;
   mounting a semiconductor chip on the central portion of the first side of the substrate; and
   coupling a lid to the stiffener frame to cover the semiconductor chip.

16. The method of claim 15, comprising forming an insulating layer over the first plurality of passive devices.

17. The method of claim 15, wherein the coupling a stiffener frame comprises coupling an insulating layer on the first and second spaced apart walls in the channel.

18. The method of claim 15, wherein the coupling a stiffener frame comprises providing the stiffener frame with a flanged lower surface and securing the flanged lower surface to the first side of the substrate with an adhesive.

19. The method of claim 15, comprising coupling a plurality of bond pads to a second side of the substrate.

20. The method of claim 15, comprising coupling a plurality of conductor pins to the second side of the substrate.

21. The method of claim 15, wherein the providing of the substrate comprises providing a coreless substrate.

* * * * *